United States Patent [19]

Foster et al.

[11] 3,759,436

[45] Sept. 18, 1973

[54] SOLDER SHIELD FOR CONTACTS ON PRINTED CIRCUIT BOARDS

[75] Inventors: Paul E. Foster; Rollie H. Little, both of Phoenix, Ariz.

[73] Assignee: General Electric Company, Lynn, Mass.

[22] Filed: Mar. 2, 1970

[21] Appl. No.: 15,395

[52] U.S. Cl. .................... 228/57, 29/203 P, 228/39

[51] Int. Cl. .................... B23k 1/00

[58] Field of Search .................... 269/310, 309, 315, 269/316; 228/33, 34, 35, 36, 57; 29/200 D, 220 P, 200 J, 203 P

[56] References Cited

UNITED STATES PATENTS

| | | | |
|---|---|---|---|
| 593,879 | 11/1897 | Du Brul | 269/310 X |
| 1,952,152 | 4/1934 | Wilkie | 269/310 X |
| 2,830,632 | 3/1958 | Rouche | 269/310 X |
| 3,284,962 | 11/1966 | Hott et al. | 269/310 X |
| 2,964,007 | 12/1960 | Buffington | 228/39 X |
| 3,081,535 | 4/1963 | Lincoln | 228/37 X |
| 3,058,440 | 10/1962 | Berry | 29/200 D |
| 3,616,984 | 11/1971 | Voroba | 228/39 X |
| 3,525,143 | 8/1970 | De Vito | 228/39 X |

*Primary Examiner*—J. Spencer Overholser
*Assistant Examiner*—Robert J. Craig
*Attorney*—William S. Wolfe, Frank L. Neuhauser, Oscar B. Waddell and Joseph B. Forman

[57] ABSTRACT

A shield for masking electrical contacts on printed circuit boards during flow soldering. The shield is made of three elongated pieces of printed circuit board material assembled to have a generally U-shaped cross section. The edge of the board carrying the contacts to be masked is inserted into the bight of the U. The shield pieces are forced together by spring-loaded bolts to seal the inserted edge.

5 Claims, 2 Drawing Figures

INVENTORS.
PAUL E. FOSTER
ROLLIE H. LITTLE
BY
Gerald R. Woods

SOLDER SHIELD FOR CONTACTS ON PRINTED CIRCUIT BOARDS

BACKGROUND OF THE INVENTION

The present invention relates to the manufacture of printed circuit boards and more particularly to a solder shield for use during such manufacture.

During the manufacture of printed circuit boards, the components which a board is to carry are positioned loosely on the board by inserting the component leads through predrilled holes in the board surface. The board is then subjected to a flow soldering process in which a wave of molten solder is directed against the undersides of the board. The solder adheres to the component leads, thus securing the components to the board and completing the electrical connection between the leads and printed circuit paths on the board surface. Because the entire underside of the printed circuit board is subjected to the wave of molten solder, any metallic contacts which are to remain solder free must be masked during the soldering operation.

There are a number of desirable characteristics for any solder shield which is to be used for this purpose. The shield should be easily secured to the board before soldering and easily removed from the board after soldering to eliminate costly production slowdowns. The shield should be inexpensive, easily made, and easily adaptable for use during the manufacture of printed circuit boards of different thicknesses and surface dimensions. The shield should also provide an effective barrier against unwanted solder deposits on contacts and should not itself be the cause of damage to contact surfaces.

Existing solder shields may have one or more but not all of these characteristics. For example, one type of solder shield now in use requires that the areas on the printed circuit board which are to be masked be dipped into a liquid solution which, after air drying, forms a solder shield. While boards of different thicknesses and surface dimensions can be accommodated using this technique, the shield which results is somewhat expensive, not always effective, and is hard to remove after the soldering process. Another type of solder shield which is now used consists of masking tape which is placed over the contacts. The use of this technique requires a considerable amount of time since the masking tape must be applied, then removed, and the board cleaned to purge the contacts of any remaining adhesive. It has now been found that some adhesive will remain on the contacts even after thorough cleaning. Even though this adhesive may not be visible, it can collect a sufficient amount of dust from the environment to cause intermittent open circuiting at the contacts. Another type of solder shield now in use consists of rubber covers extruded or molded from various heat resistant compounds for particular board designs. Since such covers are essentially custom made, they are relatively expensive and are not adaptable for use with boards of different thicknesses or different surface dimensions.

SUMMARY

The present invention is a solder shield which has each of the desirable characteristics set out above. That is, a shield constructed in accordance with the present invention is easily secured to a board before a soldering operation and is easily removed from the board after the soldering operation. A shield constructed in accordance with the present invention is inexpensive, easily manufactured, and easily adapted for use with boards of different thicknesses and surface dimensions. A shield constructed in accordance with the present invention also provides an effective barrier against unwanted solder deposits on contacts but does not by itself damage the surface of the shielded contacts.

A shield constructed in accordance with the present invention comprises one or more strips of solid material positioned over the one or more areas to be masked on a printed circuit board. The invention also includes means for clamping each of the strips of solid material against the areas to be masked.

BRIEF DESCRIPTION OF THE DRAWINGS

While the specification concludes with claims particularly pointing out and distinctly claiming that which is regarded as the present invention, certain details of a preferred embodiment of the invention along with further objects and advantages may be more readily ascertained from the following detailed description when read in conjunction with the accompanying drawings in which:

DETAILED DESCRIPTION

Figures 1, 2:
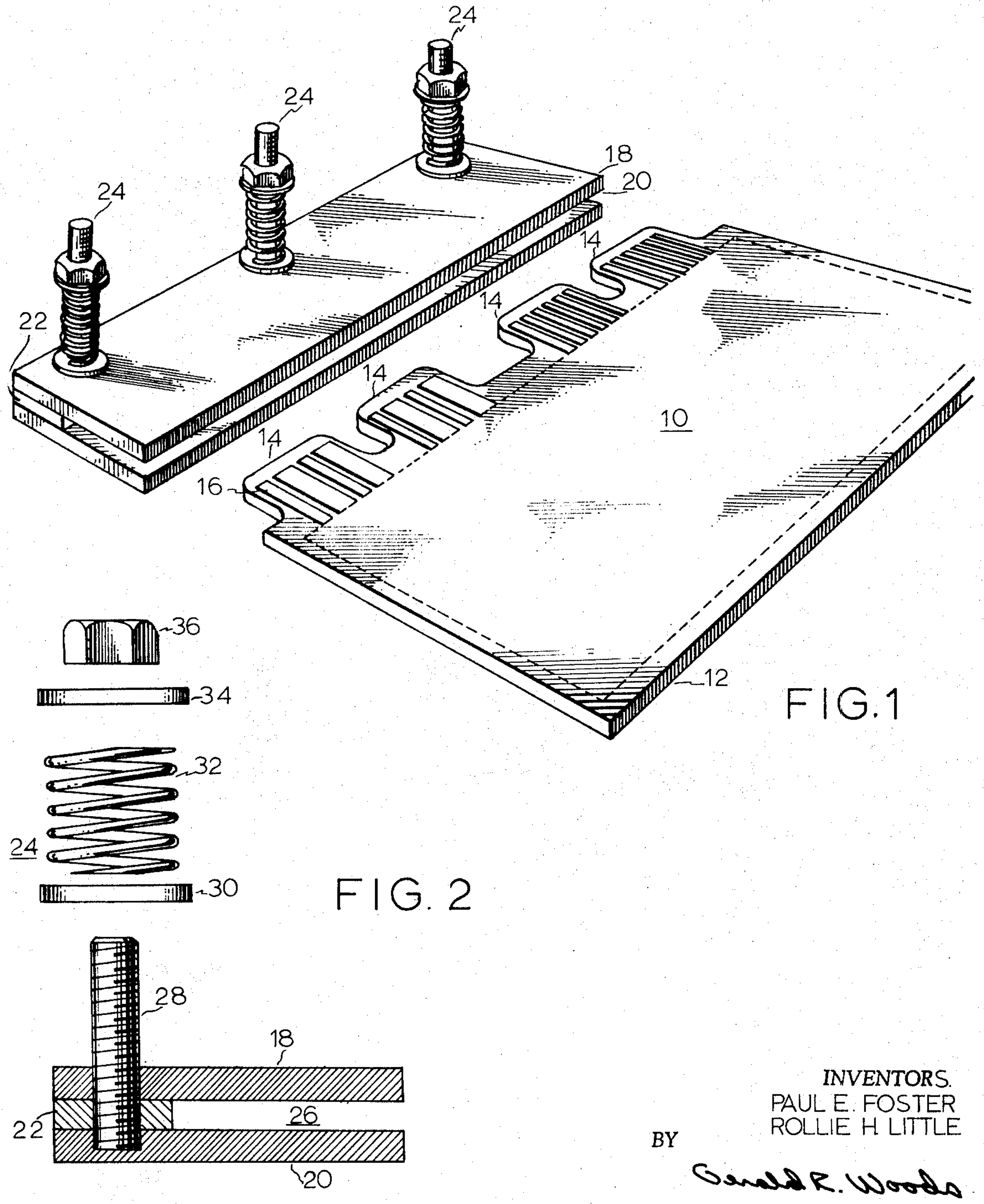
FIG. 1 is a perspective view showing an assembled solder shield and a printed circuit board having contact areas to be shielded.
FIG. 2 is an end view of the solder shield shown in FIG. 1 showing the shield strips in cross section and a disassembled clamping means.

Referring now to FIG. 1, the bottom surface 10 of a printed circuit board 12 is shown. During the manufacture of such a printed circuit board, the board would be inverted while components were positioned loosely on the opposite surface. The leads of the positioned components would extend through predrilled holes through the board and protrude slightly from the surface 10. For the sake of simplicity, the predrilled holes and printed circuit paths which normally exist on the bottom surface 10 have been omitted from FIG. 1. The printed circuit board 12 is electrically connected to an external system by means of gold leaf contacts, such as contact 16, on a number of projections 14 along one edge of the board 12. During a flow soldering operation, in which the entire surface 10 is subjected to a wave of molten solder, the contacts 16 must be shielded to prevent the buildup of solder deposits.

A solder shield constructed in accordance with the present invention is shown in FIG. 1. The shield includes first and second rectangular strips or slabs 18 and 20 of solid material held in spaced relationship by a third, narrower strip or slab 22 of the same solid material. In a preferred embodiment of the invention, the strips 18, 20 and 22 are made of the same material as the printed circuit board 12 having the contacts to be shielded. The strips 18, 20 and 22 are assembled to have a generally U-shaped cross section defining a bight portion 26 into which the projection 14 on one edge of board 12 are inserted. The contacts 16 on the projections 14 are sealed from the molten solder by means of spring-loaded bolts 24 spaced along one edge of the shield assembly. The spring-loaded bolts 24, which are described in greater detail below, form clamping means to force the strips of material 18 and 20 against opposite surfaces of the board 12.

Referring now to FIG. 2, the strips of printed circuit board material 18, 20 and 22 are depicted in cross section to more clearly show the U-shaped cross section of the assembly and the bight portion 26 which receives the projections 14 on printed circuit board 12. The clamping means which would be used in a preferred embodiment of the invention includes a threaded member or bolt 28 extending through the first strip 18 and the third strip 22 into the second strip 20 where it is anchored to limit the movement of the strip 20 relative to the bolt 28. In assembling the clamping means 24, a flat washer 30 is slipped over the bolt 28 and allowed to rest against the upper surface of the strip 18. A coil spring 32 is then placed on the bolt 28. The coil spring 32 is capped by a second flat washer 23 and the entire assembly is topped by a conventional hexagonal nut 36.

The contacts 16 on projections 14 inserted into the bight portion 26 are shielded against molten solder by screwing the nut 36 further onto the bolt 28 to compress the coil spring 32. As the spring 32 compresses, it exerts a force on flat washer 30 which tends to urge the strip 18 towards the strip 20 to seal the contacts on the projections inserted into the bight portion 26.

It should be apparent that securing the described solder shield to a printed circuit board before soldering is a simple matter and that removing the same solder shield after soldering is also a simple matter. It should also be apparent that becuase of its extreme simplicity that a solder shield constructed in accordance with the present invention is inexpensive, easily made, and easily adapted for use with boards of differnet dimensions. It has been found that the described solder shield provides a reliable solder barrier and easily accommodates boards which vary slightly in thickness along one edge. This accommodation is made possible since each of the clamping means 24 is independently adjustable to provide independently adjustable pressures along the length of a printed circuit board.

While there has been described what is believed to be a preferred embodiment of the present invention, it is to be understood that variations and modifications in the invention will occur to those skilled in the art once the invention is known to them. It is, therefore, intended that the appended claims shall be construed to include all such variations and modifications as fall within the true spirit and scope of the invention.

We claim:

1. A shield for masking selected areas on a printed circuit board during soldering operations comprising:

a. first and second strips of solid material to be positioned on opposite sides of the printed circuit board overlying the areas to be masked;

b. a plurality of threaded members, each of which is secured to one of said first and second strips in a manner which limits axial movement between the threaded member and the said one strip;

c. a plurality of spring members, each of which is held in position against the other of said first and second strips by one of the threaded members; and d. a plurality of nuts, each being threaded on one of the threaded members and being adapted to force one of the spring members into contact with the adjacent strip, whereby said first and second strips are clamped against opposite surfaces of the printed circuit board.

2. A shield for masking selected areas on a printed circuit board during soldering operations comprising:

a. an elongated member generally U-shaped in cross section defining a bight portion for receiving the printed circuit board area to be masked; and b. clamping means for urging arms of said member toward one another into contact with opposite surfaces of the printed circuit board.

3. A shield as recited in claim 2 wherein said elongated member is made from a printed circuit board material.

4. A shield as recited in claim 3 wherein said elongated member comprises:

a. first and second generally rectangular slabs of printed circuit board material; and b. a third, rectangular slab of printed circuit board material narrower than and interposed between the first and second generally rectangular slabs.

5. A shield as recited in claim 4 wherein the clamping means comprises:

a. a plurality of bolts extending through the first and third slabs into the second slab, said bolts being spaced along the length of said elongated member;

b. a plurality of coil springs, each of said springs being mounted on one of said bolts; and c. a plurality of nuts, each of said nuts being threaded onto one end of one of said bolts to compress one of said springs against the first slab of said elongated member.

* * * * *